US012643426B2

(12) United States Patent
Asakura et al.

(10) Patent No.: US 12,643,426 B2
(45) Date of Patent: Jun. 2, 2026

(54) POWER SYSTEM APPARATUS FOR ELECTRIC VEHICLES USING RANKING AND INCENTIVES

(71) Applicant: Prime Planet Energy & Solutions, Inc., Tokyo (JP)

(72) Inventors: Jun Asakura, Kakogawa (JP); Hideki Sakata, Nishinomiya (JP); Yutaka Yamauchi, Himeji (JP); Yasuhiko Ikeda, Kobe (JP); Hideyuki Nagai, Nagoya (JP); Masanori Iechika, Toyota (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 931 days.

(21) Appl. No.: 17/945,084

(22) Filed: Sep. 15, 2022

(65) Prior Publication Data

US 2023/0094931 A1      Mar. 30, 2023

(30) Foreign Application Priority Data

Sep. 17, 2021    (JP) ................................. 2021-152473

(51) Int. Cl.
*B60L 53/67*          (2019.01)
*B60L 50/60*          (2019.01)
(Continued)

(52) U.S. Cl.
CPC .............. *B60L 53/67* (2019.02); *B60L 50/60* (2019.02); *B60L 53/305* (2019.02); *B60L 53/63* (2019.02);
(Continued)

(58) Field of Classification Search
CPC ........ B60L 53/67; B60L 53/305; B60L 53/63; B60L 53/66; B60L 50/60; B60L 58/12; B60L 55/00; G01R 31/396
See application file for complete search history.

(56) References Cited

U.S. PATENT DOCUMENTS

2011/0153474 A1*   6/2011   Tormey .................. G06Q 30/04
                                                            709/204
2012/0249068 A1*  10/2012   Ishida ..................... B60L 55/00
                                                            320/109

(Continued)

FOREIGN PATENT DOCUMENTS

CN          113228447  A        8/2021
JP          2011135727 A        7/2011
(Continued)

*Primary Examiner* — David V Henze-Gongola
(74) *Attorney, Agent, or Firm* — HAUPTMAN HAM, LLP

(57)                ABSTRACT

A power system apparatus that suitably secures users of electric vehicles performing charge/discharge at the timing when power supply/demand adjustment is needed is provided. The power system apparatus disclosed herein includes: a power supply/demand information acquisition unit; a first calculator configured to calculate an urgency degree or a redundancy degree and a first rank point; a communication unit; a charge/discharge management unit; a second calculator configured to acquire a charge/discharge amount and calculate a second rank point; a rank setting unit configured to set a rank based on the first rank point calculated by the first calculator and the second rank point calculated by the second calculator; and an incentive management unit configured to calculate an incentive.

6 Claims, 6 Drawing Sheets

(51) Int. Cl.
  B60L 53/30 (2019.01)
  B60L 53/63 (2019.01)
  B60L 53/66 (2019.01)
  B60L 58/12 (2019.01)
  G01R 31/396 (2019.01)
(52) U.S. Cl.
  CPC .............. B60L 53/66 (2019.02); B60L 58/12 (2019.02); G01R 31/396 (2019.01)

(56) References Cited

U.S. PATENT DOCUMENTS

| | | | |
|---|---|---|---|
| 2017/0267115 A1* | 9/2017 | Unno ...................... B60L 58/13 |
| 2018/0218459 A1 | 8/2018 | Yokoyama et al. |
| 2020/0091752 A1 | 3/2020 | Esaka et al. |
| 2021/0334915 A1 | 10/2021 | Hishida et al. |

FOREIGN PATENT DOCUMENTS

| | | | |
|---|---|---|---|
| JP | 5440158 B2 | 3/2014 |
| JP | 5529894 B2 | 6/2014 |
| JP | 202042686 A | 3/2020 |
| JP | 6783196 B2 | 11/2020 |

* cited by examiner

| VEHICLE ID | USER ID | FIRST RANK POINT | SECOND RANK POINT | IMPARTED POINT | ACCUMULATED POINT | USER RANK |
|---|---|---|---|---|---|---|
| A101 | B101 | 60 | 50 | 110 | 5110 | A |
| A102 | B102 | 50 | 70 | 120 | 6120 | A |
| A103 | B103 | 20 | 80 | 100 | 4100 | B |
| ⋮ | ⋮ | ⋮ | ⋮ | ⋮ | ⋮ | ⋮ |

POWER SYSTEM APPARATUS FOR ELECTRIC VEHICLES USING RANKING AND INCENTIVES

CROSS REFERENCE TO RELATED APPLICATIONS

The present application claims priority from Japanese Patent Application No. 2021-152473 filed on Sep. 17, 2021, which is incorporated by reference herein in its entirety.

BACKGROUND

The technology disclosed herein relates to a power system apparatus and a power supply/demand adjustment method in which the power system apparatus is used.

In recent years, there has been proposed a power supply/demand adjustment method in which general users cooperate in the adjustment of the power supply/demand balance at a power transmission/distribution facility managed by a power company, etc., and are given a certain incentive (such as money and points) in return. In the power supply/demand adjustment method, a power supply/demand request is sent to users that have a large storage battery that can be charged and discharged repeatedly when the power supply/demand balance is lost at the power transmission/distribution facility. When accepting the request, a user connects a storage battery thereof to a power supply/demand management device, etc., to exchange power between the storage battery and the power transmission/distribution facility via the power supply/demand management device. Then, the power supply/demand management device imparts an incentive to the user in accordance with the amount of power exchanged.

An example of the power supply/demand management device discussed above is disclosed in Japanese Patent Application Publication No. 2020-42686. The power supply/demand management device described in Japanese Patent Application Publication No. 2020-42686 includes: a state supply/demand information acquisition unit that acquires state information indicating the present state of a storage battery: a performance calculation unit configured to calculate a performance index (degree of degradation of the storage battery) indicating the degree of consumption of the storage battery from the state information; and an incentive imparting unit configured to impart an incentive that matches the value of the performance index to a provider that provides a storage battery thereof as a power supply/demand adjustment unit for a power transmission/distribution system. The power supply/demand management device imparts a high incentive to a user that owns a storage battery with a high degree degradation. This prompts users hesitant about participating in the power supply/demand adjustment for fear of degradation of the storage battery, etc., to participate in the power supply/demand adjustment.

Japanese Patent No. 5529894 discloses a configuration that includes a charge/discharge spot, a data center, and a power aggregator. The power aggregator prepares a ranking list that indicates the ranking of electric vehicles in the order of the degree of necessity to charge and discharge storage batteries of the electric vehicles, the ranking being determined on the basis of information on the present position of the electric vehicles, charge state information thereon, and information on the position of the charge/discharge spot. The power aggregator guides the electric vehicles during travel to the charge/discharge spot in accordance with the ranking list.

2

SUMMARY

In the technologies described in Japanese Patent Application Publication No. 2020-42686 and Japanese Patent No. 5529894, however, it is not considered how to secure users that positively cooperate in the power supply/demand adjustment when the power supply/demand balance at the power transmission/distribution facility is significantly lost, that is, at the timing when power exchange is necessary.

The present disclosure has been made in view of such circumstances, and therefore has an object to provide a power system apparatus that suitably secures users of electric vehicles performing charge and discharge at the timing when the power supply/demand adjustment is needed. Another object is to provide a power supply/demand adjustment method in which the power system apparatus is used.

In order to achieve the above object, the technology disclosed herein provides the following power system apparatus. The power system apparatus disclosed herein includes a power supply/demand information acquisition unit, a first calculator, a communication unit, a charge/discharge management unit, a second calculator, a rank setting unit, and an incentive management unit. The power supply/demand information acquisition unit is configured to acquire power supply/demand information from a power transmission/distribution facility. The first calculator is configured to calculate an urgency degree or a redundancy degree on the basis of the power supply/demand information, and calculate a first rank point on the basis of the urgency degree or the redundancy degree. The communication unit is configured to transmit, to a user of an electric vehicle, a charge/discharge request notification that includes at least information about the calculated first rank point. The charge/discharge management unit is configured to manage a charge/discharge amount of the electric vehicle. The second calculator is configured to acquire the charge/discharge amount on the basis of data ascertained by the charge/discharge management unit, and calculate a second rank point on the basis of the charge/discharge amount. The rank setting unit is configured to set a rank based on the first rank point calculated by the first calculator and the second rank point calculated by the second calculator. The incentive management unit is configured to calculate an incentive to be imparted to the user of the electric vehicle on the basis of the rank set by the rank setting unit.

In the power system apparatus configured as discussed above, a first rank point and a second rank point are calculated, and a rank based on the rank points is set. Then, an incentive to be imparted to the user of the electric vehicle is calculated on the basis of the rank. The rank is an index that indicates a cooperative electric vehicle or user that positively participates in the power supply/demand adjustment at the timing when the power supply/demand adjustment is necessary. The first rank point is a point calculated on the basis of the urgency degree or the redundancy degree. In other words, the first rank point is a point that prompts the user to cooperate in the power supply/demand adjustment at the timing when the power supply/demand adjustment is necessary. The second rank point is a point calculated on the basis of the charge/discharge amount. In other words, the second rank point is calculated as a point to be imparted to the user that actually performs charge or discharge at the timing when the power supply/demand adjustment is necessary. With such a configuration, the user of the electric vehicle can gain an incentive that matches his/her rank (i.e., whether or not the user is cooperative in the power supply/demand adjustment at a necessary timing). Consequently, it is possible to suitably secure users of electric vehicles that positively perform charge or discharge at the timing when the power supply/demand adjustment is necessary.

In an aspect of the power system apparatus disclosed herein, the first calculator may be configured to calculate a higher first rank point as the urgency degree or the redundancy degree is higher.

With such a configuration, a higher first rank point is calculated for users that positively cooperate when the urgency degree or the redundancy degree is high. Consequently, it is possible to suitably secure users of electric vehicles that perform charge or discharge at the timing when the power supply/demand adjustment is necessary.

In an aspect of the power system apparatus disclosed herein, the power supply/demand information acquired by the power supply/demand information acquisition unit may include at least a predicted power demand amount and a predicted power supply amount. The first calculator may be configured to calculate the urgency degree and calculate the first rank point on the basis of a first rate in the case where the predicted power demand amount is more than the predicted power supply amount. The first calculator may be configured to calculate the redundancy degree and calculate the first rank point on the basis of a second rate, which is lower than the first rate, in the case where the predicted power supply amount is more than the predicted power demand amount.

With such a configuration, a particularly high first rank point is calculated in the case where the predicted power demand amount is more than the predicted power supply amount, that is, in the case where an urgency degree is calculated. Consequently, it is possible to prompt more users of electric vehicles to participate in the power supply/demand adjustment when the urgency degree is high.

In an aspect of the power system apparatus disclosed herein, the power system apparatus may further include a selector configured to select a transmission destination for the charge/discharge request notification. The selector may be configured to select users of electric vehicles for transmission destination for the charge/discharge request notification sequentially in a descending order of the rank.

With such a configuration, information about charge and discharge is preferentially transmitted to users of electric vehicles that cooperate by positively performing charge or discharge at the timing when the power supply/demand adjustment is necessary. Consequently, it is possible to preferentially guide users that are highly likely to perform charge or discharge at the timing when the power supply/demand adjustment is necessary to the charge/discharge device. Therefore, it is possible to immediately stabilize the power supply/demand balance.

Another aspect provides a power supply/demand adjustment method disclosed herein. The power supply/demand adjustment method disclosed herein is a power supply/demand adjustment method of adjusting a power supply/demand balance at a power transmission/distribution facility using an electric vehicle. The power supply/demand adjustment method includes: acquiring power supply/demand information from the power transmission/distribution facility: calculating an urgency degree or a redundancy degree on the basis of the power supply/demand information: calculating a first rank point on the basis of the calculated urgency degree or redundancy degree: transmitting, to a user of the electric vehicle, a charge/discharge request notification that includes at least the first rank point; managing a charge/discharge state of the electric vehicle using a charge/discharge management unit: acquiring a charge/discharge amount of the electric vehicle on the basis of the managed charge/discharge state: calculating a second rank point on the basis of the charge/discharge amount: setting a rank on the basis of the calculated first rank point and second rank point; and calculating an incentive to be imparted to the user of the electric vehicle on the basis of the rank.

With such a configuration, a rank is set on the basis of the first rank point calculated on the basis of the urgency degree or the redundancy degree and the second rank point calculated on the basis of the charge/discharge amount. Then, an incentive is imparted on the basis of the rank. That is, users of electric vehicles that positively participate in the power supply/demand adjustment at the timing when the power supply/demand adjustment is necessary can gain an incentive that matches their ranks. Consequently, it is possible to secure users of electric vehicles that positively perform charge or discharge at the timing when the power supply/demand adjustment is necessary.

In an aspect of the power supply/demand adjustment method disclosed herein, in the step of calculating the first rank point, the first rank point may be calculated so as to be higher as the urgency degree or the redundancy degree calculated on the basis of the power supply/demand information is higher.

With such a configuration, a higher first rank point is calculated for users that perform charge or discharge when the urgency degree or the redundancy degree is high, that is, at the timing when the power supply/demand adjustment is needed. Consequently, it is possible to effectively prompt users to participate in the power supply/demand adjustment at the timing when the power supply/demand adjustment is needed.

In an aspect of the power supply/demand adjustment method disclosed herein, the power supply/demand information acquired in the acquiring the power supply/demand information may include at least a predicted power demand amount and a predicted power supply amount: in the step of calculating the urgency degree or the redundancy degree, in the case where the predicted power demand amount is more than the predicted power supply amount, the urgency degree may be calculated; and in the step of calculating the urgency degree or the redundancy degree, in the case where the predicted power supply amount is more than the predicted power demand amount, the redundancy degree may be calculated. In another aspect, in the case where the urgency degree is calculated, the first rank point may be calculated on the basis of a first rate, in the step of calculating the first rank point; and in the case where the redundancy degree is calculated, the first rank point may be calculated on the basis of a second rate, which is lower than the first rate, in the step of calculating the first rank point.

With such a configuration, a particularly high first rank point can be calculated for users that perform charge or discharge when the urgency degree is high. Consequently, it is possible to particularly prompt users to supply power to the power transmission/distribution facility when the urgency degree is high, that is, when the predicted power demand amount is more than the predicted power supply amount and a power shortage is predicted.

In an aspect of the power supply/demand adjustment method disclosed herein, the method may further include selecting a transmission destination for the charge/discharge request notification, and users of electric vehicles may be selected for transmission destination for the charge/discharge request notification sequentially in a descending order of the rank.

With such a configuration, it is possible to preferentially guide users of electric vehicles that positively perform charge or discharge at the timing when the power supply/demand adjustment is necessary to the charge/discharge device. Consequently, it is possible to immediately stabilize the power supply/demand balance.

BRIEF DESCRIPTION OF THE DRAWINGS

FIG. 4 is a table indicating an example of a database stored in a storage:

DETAILED DESCRIPTION

Figure 1:
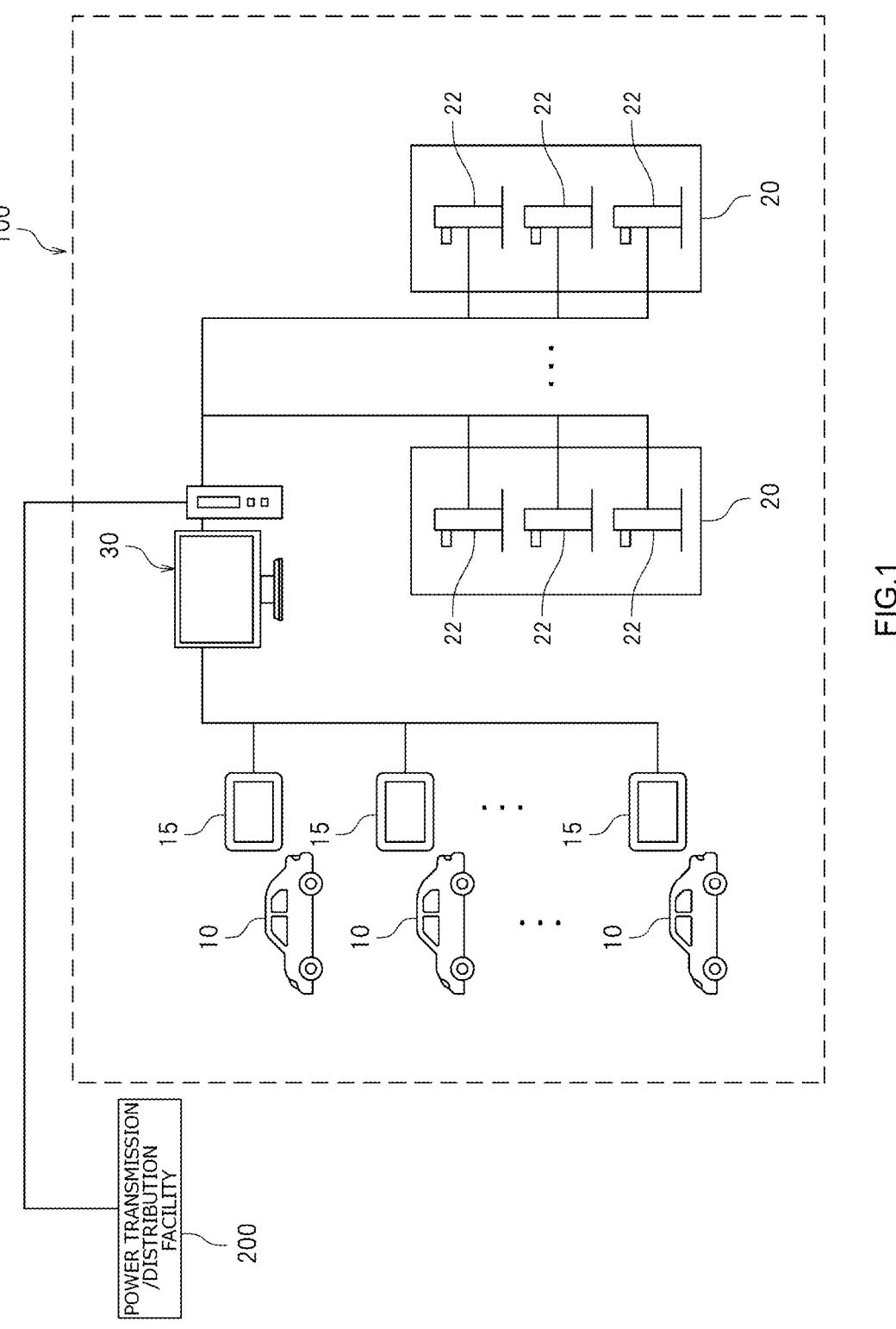
FIG. 1 is a conceptual diagram illustrating a power system apparatus according to an embodiment.

A power system apparatus according to an embodiment disclosed herein will be described below with reference to the drawings. Matters that are not mentioned herein but are necessary to implement the present disclosure may be grasped as design matters for a person skilled in the art based on the related art in the relevant field. The embodiment described herein is not intended to specifically limit the present disclosure as a matter of course. The present disclosure is not limited to the embodiment described herein unless specifically stated otherwise. Members and portions that achieve the same effect are denoted by the same reference numerals as appropriate to omit redundant description as appropriate.

FIG. 1 is a conceptual diagram illustrating a power system apparatus disclosed herein. A power system apparatus 100 disclosed herein is an apparatus that manages charge and discharge (herein referred to as "charge/discharge") of electric vehicles 10, in order to contribute to stabilizing the power supply/demand balance of a power transmission/distribution facility 200. The power system apparatus 100 includes a power storage device that stores power, although not illustrated. The power system apparatus 100 manages supply (herein "charge") of power stored in the power storage device to the electric vehicles 10 and supply (herein "discharge") of power from the electric vehicles 10 to the power storage device. The power supplied to the power storage device may be sold to a particular power company etc. Meanwhile, the power stored in the power storage device can be bought by users of the electric vehicles 10. The power system apparatus 100 may be an apparatus that is used to sell and buy power.

The power system apparatus 100 is implemented by a client server system, for example. However, the power system apparatus 100 may be implemented through cloud computing.

The electric vehicles 10 are vehicles that use electricity as an energy source. The electric vehicles 10 are a type of transport devices, and may be four-wheeled vehicles or may be two-wheeled vehicles. The electric vehicles 10 may be battery electric vehicles (BEVs) that include a storage battery as a drive source, or may be hybrid electric vehicles (HEVs) that include a storage battery and an internal combustion engine as drive sources. The term "hybrid electric vehicles" as used herein includes plug-in hybrid electric vehicles (PHEVs) that include a charge device that supplies power from a stationary power source to the storage battery. The electric vehicles 10 preferably include a control device (electronic control unit: ECU) for an electric system that can measure the state of charge (SOC) of the storage battery etc.

The ECU manages various states of the storage battery mounted on the vehicle. The ECU includes a voltage sensor, a current sensor, a temperature sensor, etc. (not illustrated) in order to manage the states of the storage battery. The ECU receives and stores an inter-terminal voltage input from the voltage sensor, a charge/discharge current input from the current sensor, a battery temperature input from the temperature sensor, etc. as signals that are necessary to manage the storage battery, for example. The ECU can measure the SOC of the storage battery of the electric vehicle 10 on the basis of the input signals.

It is only necessary that user terminals 15 should be configured to be able to bidirectionally communicate with a resource aggregator 30. The user terminals 15 may be car navigation systems mounted on the electric vehicles 10, or smartphones, tablet terminals, or desktop or laptop personal computers that are used by users, for example.

Charge/discharge devices 22 are devices that can be electrically connected to the electric vehicles 10 to charge and discharge the electric vehicles 10. The charge/discharge devices 22 are installed at charge/discharge spots 20. The number of charge/discharge devices 22 installed at a single charge/discharge spot 20 is not specifically limited. That is, one or a plurality of charge/discharge devices 22 are installed at a single charge/discharge spot 20. The charge/discharge spots 20 are each managed by a predetermined management device (not illustrated). That is, one or a plurality of charge/discharge devices 22 installed at a single charge/discharge spot 20 are managed by the single management device. The charge/discharge spots 20 may be parking lots in which the charge/discharge devices 22 are installed, for example. The parking lots are not specifically limited, and may be parking lots for a shop that sells products, parking lots for a shop that provides a service such as a beauty salon, parking lots for large-scale commercial facilities, parking lots for a house, etc., for example.

The resource aggregator 30 herein manages the power system apparatus 100. The resource aggregator 30 is connected to the user terminals 15, the power transmission/distribution facility 200, and the charge/discharge devices 22 so as to be able to bidirectionally communicate therewith, and collectively manages information obtained from the user terminals 15, the power transmission/distribution facility 200, and the charge/discharge devices 22. The resource aggregator 30 may be implemented by a single computer, or may be jointly implemented by a plurality of computers.

The resource aggregator 30 controls the supply/demand amount of power so as to keep the power supply/demand balance at the power transmission/distribution facility 200. The resource aggregator 30 procures and supplies power in accordance with a power supply request from the power transmission/distribution facility 200, for example. Alternatively, the resource aggregator 30 demands power in accordance with a power demand request from the power transmission/distribution facility 200. For example, the power system apparatus 100 has one or a plurality of users that use or own the electric vehicle 10 as registered therein, and one or a plurality of charge/discharge devices 22 that charge and discharge the electric vehicle 10 as registered therein. The power system apparatus 100 may have the electric vehicles 10 themselves as registered therein. The power system apparatus 100 manages power by supplying (herein "charging") power from the charge/discharge devices 22 to the electric vehicles 10 and supplying (herein "discharging") power from the electric vehicles 10 to the charge/discharge devices 22.

The power transmission/distribution facility 200 is a facility that supplies power, which is supplied from power plants that can supply power to the power transmission/distribution facility 200, to power consuming facilities. The term "power plants" as used herein may refer to facilities that include power generating equipment known in the art, such as thermal power plants, wind power plants, hydraulic power plants, atomic power plants, and photovoltaic power plants, for example. The term "power consuming facilities" may refer to facilities such as houses, commercial facilities, factories, and schools, for example.

Figure 2:
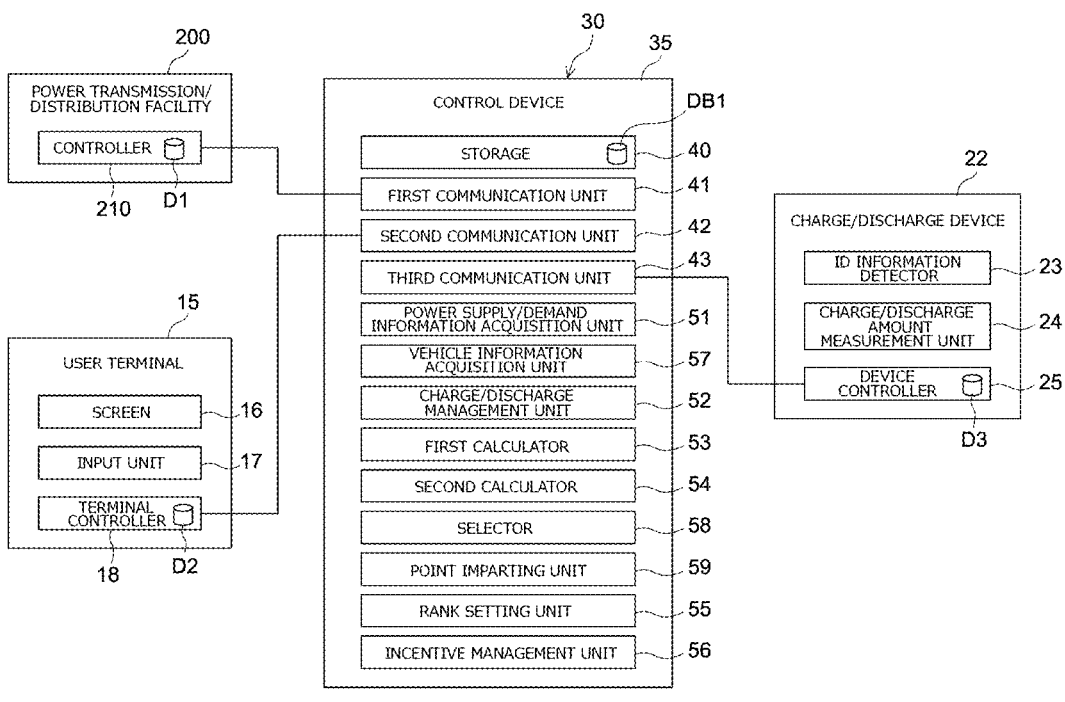
FIG. 2 is a block diagram illustrating a resource aggregator, a power transmission/distribution facility, a user terminal, and a charge/discharge device according to the embodiment.

Next, an example of a specific configuration of the power system apparatus 100 disclosed herein will be described. FIG. 2 is a block diagram illustrating the resource aggregator 30 etc. As illustrated in FIG. 2, the resource aggregator 30 includes a control device 35. The configuration of the control device 35 is not specifically limited. The control device 35 includes a read only memory (ROM) that stores a program for control, a central processing unit (CPU) that can execute the program, a random access memory (RAM) that is used as a working area for developing the program, a storage device such as a memory that stores the program and various kinds of data, and input/output ports.

The control device 35 of the power system apparatus 100 disclosed herein includes a power supply/demand information acquisition unit 51, a charge/discharge management unit 52, a first calculator 53, a second calculator 54, a rank setting unit 55, and an incentive management unit 56. The control device 35 also includes, in addition to the units 51 to 56, a storage 40, a first communication unit 41, a second communication unit 42, a third communication unit 43, a vehicle information acquisition unit 57, a selector 58, and a point imparting unit 59. The various units 40 to 58 that constitute the control device 35 may be implemented by one or a plurality of processors, or may be incorporated in a circuit.

The first communication unit 41 is configured to be able to communicate with the power transmission/distribution facility 200. The power transmission/distribution facility 200 includes a controller 210 that can communicate with at least the first communication unit 41. The first communication unit 41 is connected to be able to communicate with the controller 210 of the power transmission/distribution facility 200, for example.

The controller 210 stores in advance power supply/demand information D1 on the power transmission/distribution facility 200. The power supply/demand information D1 is information about the power supply/demand balance of the power transmission/distribution facility 200. The power supply/demand information D1 includes at least a predicted power demand amount and a predicted power supply amount at the power transmission/distribution facility 200. The predicted power demand amount is a predicted value of the amount of power to be supplied from the power transmission/distribution facility 200 to the power consuming facilities discussed above. The predicted power supply amount is a predicted value of the amount of power to be supplied from the power plants discussed above to the power transmission/distribution facility 200.

The second communication unit 42 is configured to be able to communicate with the user terminal 15 of a user that uses (owns) the electric vehicle 10. The second communication unit 42 is an example of the communication unit of the power system apparatus disclosed herein. As illustrated in FIG. 2, the user terminal 15 includes a screen 16, an input unit 17 that is operated by the user to make an input such as a touch screen, a keyboard, and a mouse, and a terminal controller 18. The terminal controller 18 is connected to be able to communicate with the screen 16 and the input unit 17. The second communication unit 42 is connected to be able to communicate with the terminal controller 18 of the user terminal 15.

The user terminal 15 stores in advance vehicle information D2 on the electric vehicle 10. The user terminal 15 may be configured to transmit the vehicle information D2 to the resource aggregator 30 at predetermined intervals. The vehicle information D2 is information about the electric vehicle 10 that is used by the user. The vehicle information D2 may include the state of charge (SOC) of the electric vehicle 10, information on the present position of the electric vehicle 10, an expected travel distance of the electric vehicle 10, etc., for example.

The third communication unit 43 is configured to be able to communicate with the charge/discharge device 22 installed at the charge/discharge spot 20. The charge/discharge device 22 includes an identification (ID) information detector 23, a charge/discharge amount measurement unit 24, and a device controller 25. The device controller 25 is connected to be able to communicate with the ID information detector 23 and the charge/discharge amount measurement unit 24. The third communication unit 43 is connected to be able to communicate with the device controller 25 of the charge/discharge device 22.

The ID information detector 23 acquires a vehicle ID of the electric vehicle 10 electrically connected to the charge/discharge device 22 to be charged or discharged and a user ID of the user that uses (owns) the electric vehicle 10 (hereinafter collectively referred to as "ID information"). The charge/discharge amount measurement unit 24 measures the amount of power (charge/discharge amount) by which the electric vehicle 10 electrically connected to the charge/discharge device 22 is charged or discharged. The amount of power (charge amount) by which the electric vehicle 10 is charged means the amount of power supplied from the power transmission/distribution facility 200 to the electric vehicle 10. Meanwhile, the amount of power (discharge amount) discharged from the electric vehicle 10 means the amount of power supplied from the electric vehicle 10 to the power transmission/distribution facility 200.

The device controller 25 stores the acquired ID information and the charge/discharge amount in association with each other as charge/discharge information D3. The charge/discharge information D3 may include, in addition to the above information, information such as the ID of the charge/discharge device 22 that has performed charge or discharge and the ID of the charge/discharge spot 20 at which the charge/discharge device 22 is installed, for example.

The power supply/demand information acquisition unit 51 acquires the power supply/demand information D1 discussed above. The power supply/demand information D1 is stored in advance in the controller 210 of the power transmission/distribution facility 200. Therefore, the power supply/demand information acquisition unit 51 acquires the power supply/demand information D1 via the first communication unit 41.

The vehicle information acquisition unit 57 acquires the vehicle information D2 discussed above. The vehicle information D2 is stored in advance in the terminal controller 18 of the user terminal 15. Therefore, the vehicle information acquisition unit 57 acquires the vehicle information D2 via the second communication unit 42.

The charge/discharge management unit 52 manages the charge/discharge amount of the electric vehicle 10 electrically connected to the charge/discharge device 22 to be charged or discharged. For example, the charge/discharge management unit 52 may be configured to receive a charge/discharge signal transmitted when the electric vehicle 10 is electrically connected to the charge/discharge device 22 to start and end charge or discharge. Consequently, the resource aggregator 30 can confirm that charge or discharge has been performed between the charge/discharge device 22 and the electric vehicle 10, and grasp the charge/discharge amount of the electric vehicle 10.

Figure 3:
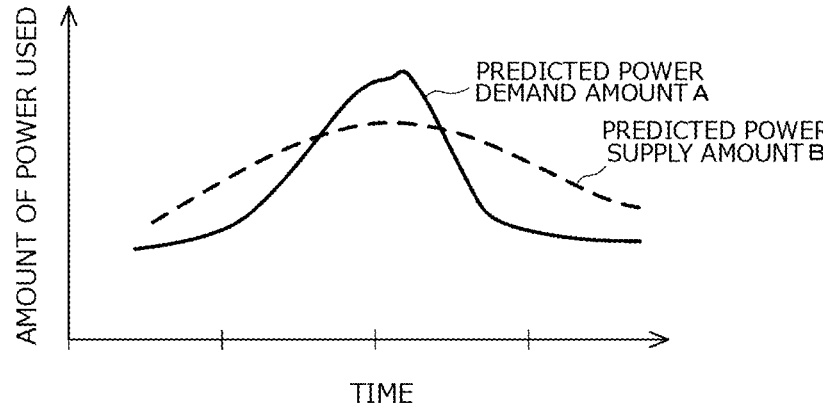
FIG. 3 illustrates calculation of an urgency degree or a redundancy degree of the power system apparatus according to the embodiment.

The first calculator 53 calculates an urgency degree or a redundancy degree on the basis of the power supply/demand information D1 acquired by the power supply/demand information acquisition unit 51, and calculates a first rank point based on the urgency degree or the redundancy degree. The urgency degree and the redundancy degree will be described. As illustrated in FIG. 3, the urgency degree and the redundancy degree are calculated from a predicted power demand amount A at X hours later and a predicted power supply amount B at X hours later. Specifically, the urgency degree and the redundancy degree can be calculated using a formula (predicted power demand amount at X hours later-predicted power supply amount at X hours later)/X, for example. When the predicted power demand amount is more than the predicted power supply amount, it is predicted that power will be short at the power transmission/distribution facility 200. When the predicted power supply amount is more than the predicted power demand amount, on the other hand, it is predicted that power will be redundant at the power transmission/distribution facility 200.

In the power system apparatus 100 according to an aspect disclosed herein, the first calculator 53 is configured to calculate an urgency degree when the predicted power demand amount is more than the predicted power supply amount, and to calculate a redundancy degree when the predicted power supply amount is more than the predicted power demand amount. The first calculator 53 is configured to then calculate a first rank point on the basis of the urgency degree or the redundancy degree. A user that desires to gain as high a first rank point as possible is expected to participate in the power supply/demand adjustment at the timing when charge or discharge is needed.

When the urgency degree or the redundancy degree calculated by the first calculator 53 is high, it may be desired to immediately stabilize the power supply/demand balance at the power transmission/distribution facility 200. Thus, the first calculator 53 is preferably configured to calculate a higher first rank point as the urgency degree or the redundancy degree is higher. Consequently, it is possible to promote the user of the electric vehicle 10 to participate in the power supply/demand adjustment adequately at the timing when the power supply/demand adjustment is needed.

The first calculator 53 is preferably configured to calculate a first rank point on the basis of a first rate when the predicted power demand amount more than the predicted power supply amount and the urgency degree is calculated. In addition, the first calculator 53 is preferably configured to calculate a first rank point on the basis of a second rate, which is lower than the first rate, when the predicted power supply amount more than the predicted power demand amount and a redundancy degree is calculated. The first rate and the second rate are each a coefficient that is used to calculate a first rank point. A higher first rank point is calculated as the rate is higher. That is, in the configuration discussed above, the first calculator 53 is configured to calculate a high first rank point in the case where an urgency degree is calculated compared to the case where a redundancy degree is calculated. With such a configuration, a particularly high first rank point is calculated when the urgency degree is high. Thus, the user of the electric vehicle 10 can be promoted to participate in the power supply/demand adjustment more suitably when the urgency degree is particularly high. Consequently, it is possible to suitably secure users that participate in the power supply/demand adjustment when the urgency degree is particularly high.

The second communication unit 42 is configured to transmit, to the user terminal 15, a charge/discharge request notification that includes at least information about the calculated first rank point. The charge/discharge request notification is a notification that requests the user of the electric vehicle 10 to charge or discharge the charge/discharge device 22. The user of the electric vehicle 10 can determine whether or not to charge or discharge the charge/discharge device 22 using his/her own electric vehicle 10, by confirming the charge/discharge request notification presented to his/her own user terminal 15. The charge/discharge request notification may include, besides information about the first rank point, which of charge and discharge is requested, the position of the charge/discharge spot 20 that can be used, information on roads to the charge/discharge spot 20, information on the power selling and buying prices, etc. The expression "charge/discharge spot 20 that can be used" refers to the charge/discharge device 22 installed at the charge/discharge spot 20 that is not being used.

The second calculator 54 is configured to calculate a second rank point on the basis of the charge/discharge amount acquired by the charge/discharge management unit 52. The second rank point is calculated on the basis of the amount of power that is actually supplied (discharged) or demanded (charged) when the electric vehicle 10 is electrically connected to the charge/discharge device 22. That is, the second rank point is a point imparted to the user that has performed charge or discharge at the timing when charge or discharge is needed.

The first and second rank points are elements that constitute setting of a rank to be discussed later, and are points to be imparted to each user. The first rank point is calculated on the basis of the urgency degree or the redundancy degree. The second rank point is calculated on the basis of the charge/discharge amount. The first rank point, which is based on the urgency degree or the redundancy degree, can prompt the user to participate in the power supply/demand adjustment at the timing when charge or discharge is needed. The second rank point, which is based on the charge/discharge amount, can reflect a substantial degree of contribution. By calculating the first and second rank points in this manner, an appropriate charge/discharge amount can be obtained at the timing when charge or discharge is necessary.

The rank setting unit 55 is configured to set a rank on the basis of the first rank point calculated by the first calculator 53 and the second rank point calculated by the second calculator 54. The rank is set in association with the vehicle ID or the user ID. The rank is an index that indicates a cooperative electric vehicle or user that positively participates in the power supply/demand adjustment at the timing when the power supply/demand adjustment is necessary. The rank is preferably set in accordance with the total of the first rank point and the second rank point for a period since a predetermined timing until the present. While the rank (hereinafter referred to as "user rank") set in association with the user ID is described as an example, it is not intended to specifically limit the technology disclosed herein.

The user rank set by the rank setting unit 55 is managed by the database DB1. The database DB1 is stored in advance in the storage 40. The user of the electric vehicle 10 that transmitted a charge/discharge signal to the charge/discharge management unit 52 and the user rank set by the rank setting unit 55 are saved in association with each other in the database DB1. When a user rank is set by the rank setting unit 55 in step S60 in FIG. 7, the user rank is saved in the database DB1.

FIG. 4 is a table indicating an example of the database DB1 stored in the storage 40. The database DB1 stores the vehicle ID, the user ID, the first rank point, the second rank point, the imparted point, the accumulated point, and the user rank in correlation with each other, for example.

The vehicle ID stores identification information on the electric vehicle 10 charged or discharged using the charge/discharge device 22. The user ID stores identification information on the user that uses the electric vehicle 10. In the case where the user uses (owns) a plurality of electric vehicles 10 and has the plurality of electric vehicles 10 charged or discharged, a plurality of vehicle IDs may be registered for a single user ID. The first rank point stores a first rank point calculated by the first calculator 53 on the basis of the urgency degree or the redundancy degree. The second rank point stores a second rank point calculated by the second calculator 54 on the basis of the charge/discharge amount. The imparted point stores the total of the first and second rank points. The accumulated point stores the total of the first and second rank points imparted to the user since a predetermined timing until the present. The user rank stores a rank set by the rank setting unit 55 on the basis of the accumulated point. While a case where a user possesses a plurality of vehicles and a rank is set for each user has been described above, a rank may be set for each vehicle.

The incentive management unit 56 is configured to calculate an incentive to be imparted to the user that transmitted a charge/discharge signal to the charge/discharge management unit 52 on the basis of the rank set by the rank setting unit 55. Specifically, the incentive management unit 56 is configured to set a higher incentive to the user of the electric vehicle 10 at a higher rank with reference to the database DB1.

The incentive is not specifically limited as long as the incentive can be adjusted for each user and promotes the user to participate in the power supply/demand adjustment. The incentive may be money, a coupon, a complimentary ticket, a discount on the electricity charge, etc., for example. Specifically, the coupon may be a coupon that increases the rate at which the user will be paid when power is discharged from the electric vehicle 10, or may be a coupon that reduces the rate at which the user will pay when the electric vehicle 10 is charged, for example. By imparting an incentive that matches the rank, the user of the electric vehicle 10 is surmised to positively perform charge or discharge when the urgency degree or the redundancy degree is high, in order to reach a higher rank.

The selector 58 selects a transmission destination for the charge/discharge request notification discussed above. The second communication unit 42 transmits a charge/discharge request notification to the transmission destination selected by the selector 58. The selector 58 may select a transmission destination on the basis of the vehicle information D2 acquired by the vehicle information acquisition unit 57, for example. Alternatively, the selector 58 may select a transmission destination on the basis of the rank.

In the power system apparatus 100 configured as discussed above, a first rank point based on an urgency degree or a redundancy degree and a second rank point based on a substantial charge/discharge amount are calculated, and a rank is set on the basis of the first and second rank points. Then, an incentive based on the rank is calculated and imparted. Consequently, it is surmised that a user that desires to gain a higher incentive performs more charge or discharge when the urgency degree or the redundancy degree is higher. Therefore, the resource aggregator 30 can secure more users that positively participate in the power supply/demand adjustment at the timing when the power supply/demand adjustment is necessary. Thus, with the power system apparatus 100 with such a configuration, it is possible to adjust the power supply/demand balance of the power transmission/distribution facility 200 more suitably.

Figure 5:
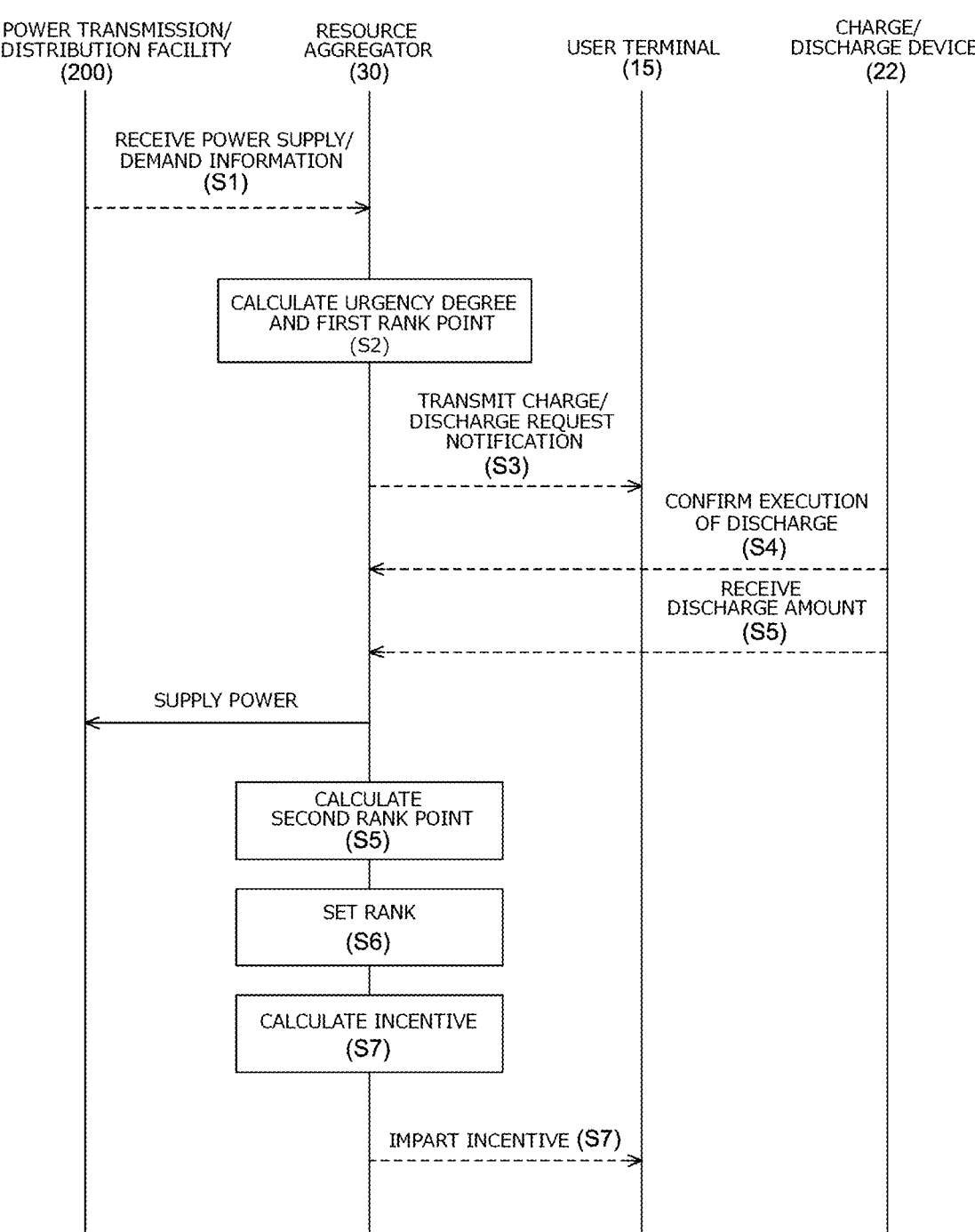
FIG. 5 is a sequence diagram illustrating an example of process procedures by the power system apparatus according to the embodiment.
Figure 6:
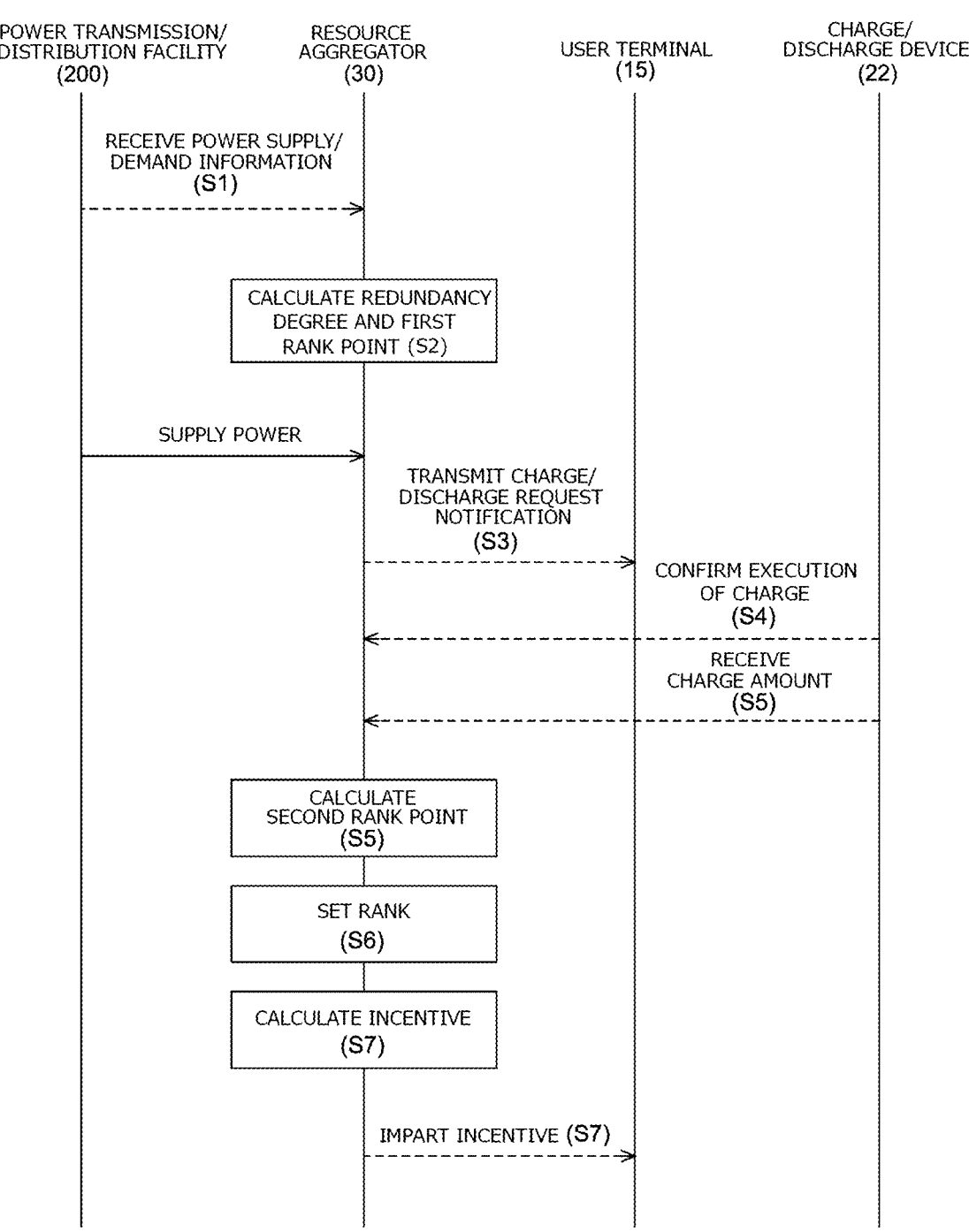
FIG. 6 is a sequence diagram illustrating another example of the process procedures by the power system apparatus according to the embodiment.

Then, a power supply/demand adjustment process to be performed with the constitutions illustrated in FIGS. 1 and 2 will be described. FIGS. 5 and 6 are each a sequence diagram illustrating a power supply/demand adjustment process performed in order to adjust the power supply/demand balance at the power transmission/distribution facility 200 using the electric vehicle 10. FIG. 5 illustrates a process for a case where the predicted power demand amount is more than the predicted power supply amount. FIG. 6 illustrates a process for a case where the predicted power supply amount is more than the predicted power demand amount.

As illustrated in FIGS. 5 and 6, the resource aggregator 30 receives power supply/demand information D1 from the power transmission/distribution facility 200 (S1). The resource aggregator 30 calculates an urgency degree or a redundancy degree on the basis of the power supply/demand information D1, and calculates a first rank point on the basis of the urgency degree or the redundancy degree (S2). In the case where a redundancy degree is calculated in step S2 as illustrated in FIG. 6, power is supplied from the power transmission/distribution facility 200. Then, the resource aggregator 30 transmits a charge/discharge request notification to the user terminal 15 of the user that uses the electric vehicle 10 (S3). The charge/discharge request notification includes at least information about the calculated first rank point. The user of the electric vehicle 10 that accepts a charge/discharge request after confirming the charge/discharge request notification electrically connects the electric vehicle 10 that the user himself/herself uses to the charge/discharge device 22. The resource aggregator 30 confirms that charge or discharge has been performed (S4). In addition, the resource aggregator 30 acquires the charge amount or the discharge amount between the electric vehicle 10 and the charge/discharge device 22 (S5). In the case where discharge is confirmed as illustrated in FIG. 5, the resource aggregator 30 supplies power based on the discharge amount to the power transmission/distribution facility 200. The resource aggregator 30 calculates a second rank point on the basis of the acquired charge/discharge amount (S5). Then, the resource aggregator 30 sets a rank on the basis of the calculated first rank point and second rank point (S6).

Finally, the resource aggregator 30 calculates an incentive to be imparted to the user of the electric vehicle 10 on the basis of the rank (S7). The power supply/demand adjustment is implemented using the electric vehicle 10 by performing such processes.

Figure 7:
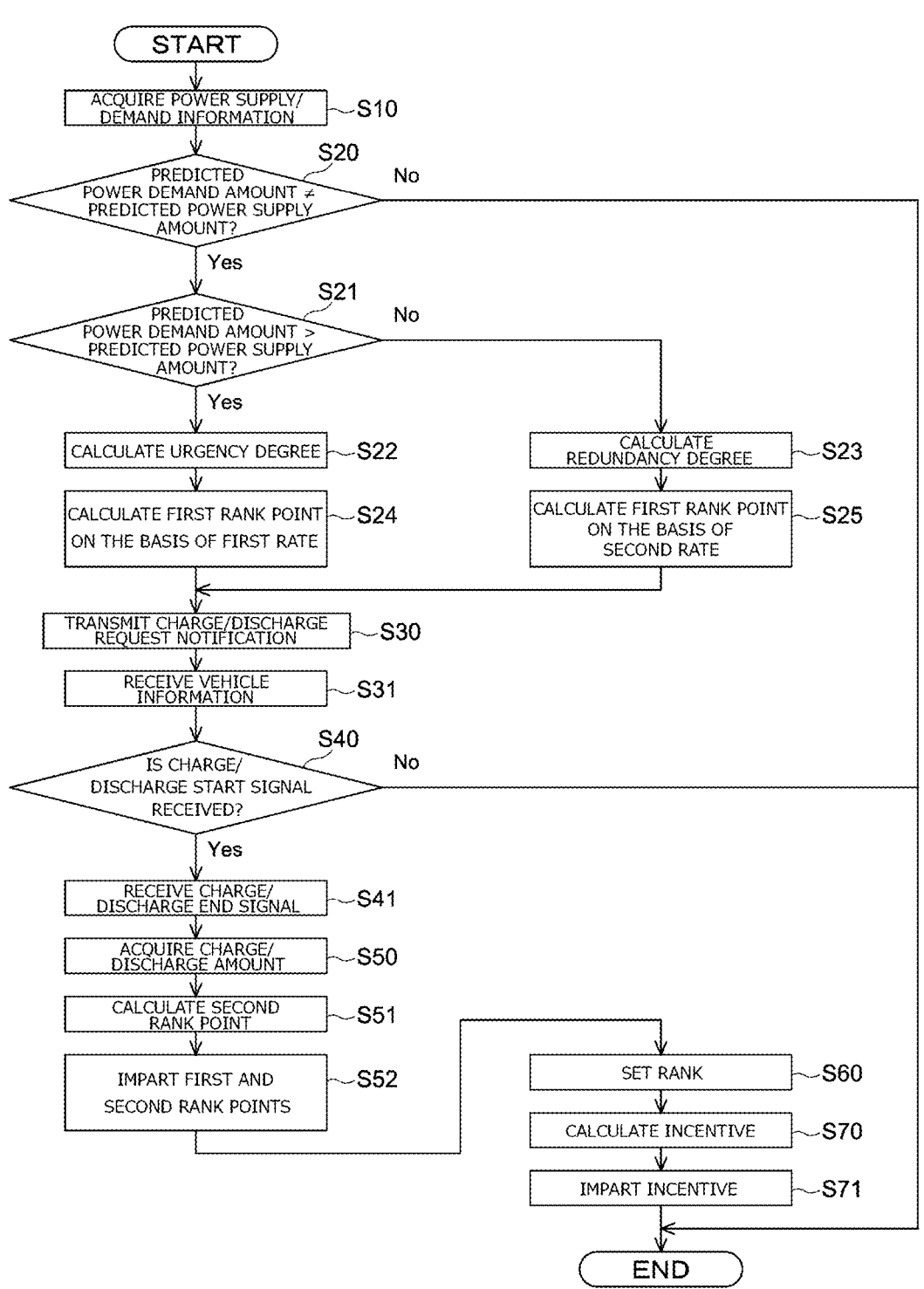
FIG. 7 is a flowchart illustrating the process procedures by the power system apparatus according to the embodiment.

Then, steps S1 to S7 in FIGS. 5 and 6 discussed above will be described in more detail with reference to FIG. 7. FIG. 7 is a flowchart of the power supply/demand adjustment disclosed herein. In order to perform the power supply/demand adjustment according to the urgency degree or the redundancy degree, the power system apparatus 100 disclosed herein performs steps S1 to S7 in FIGS. 5 and 6 as follows.

Step S10 in FIG. 7 is performed in S1 in FIGS. 5 and 6. In step S10, the power supply/demand information acquisition unit 51 in FIG. 2 acquires power supply/demand information D1 from the power transmission/distribution facility 200. The power supply/demand information D1 to be acquired is information about the power supply/demand balance at the power transmission/distribution facility 200 as discussed above, and includes at least a predicted power demand amount and a predicted power supply amount at the power transmission/distribution facility 200.

Steps S20 to S25 in FIG. 7 are performed in S2 in FIGS. 5 and 6. In steps S20 to S23, an urgency degree or a redundancy degree is calculated on the basis of the power supply/demand information D1 acquired in step S10. In steps S24 and S25, a first rank point is calculated on the basis of the calculated urgency degree or redundancy degree.

In step S20, the first calculator 53 in FIG. 2 determines whether or not the predicted power demand amount and the predicted power supply amount acquired by the power supply/demand information acquisition unit 51 disagree with each other. In the case where the predicted power demand amount and the predicted power supply amount disagree with each other (step S20: YES), the process proceeds to step S21. In the case where the predicted power demand amount and the predicted power supply amount are equal to each other, the process is ended, since the power supply/demand balance is good and it is not necessary to perform the power supply/demand adjustment process based on the urgency degree or the redundancy degree.

In step S21, the first calculator 53 in FIG. 2 determines whether or not the predicted power demand amount acquired by the power supply/demand information acquisition unit 51 is more than the predicted power supply amount. In the case where the predicted power demand amount is more than the predicted power supply amount (step S21: YES), the process proceeds to step S22. In step S22, the first calculator 53 calculates an urgency degree. Then, in step S24, the first calculator 53 calculates a first rank point on the basis of the first rate. The first rank point is preferably calculated in accordance with how high the urgency degree is. The first rank point may be calculated on the basis of the product of the urgency degree and the first rate, although the present disclosure is not specifically limited thereto.

In the case where the predicted power demand amount is not more than the predicted power supply amount (step S21: NO), on the other hand, the process proceeds to step S23. In step S23, the first calculator 53 calculates a redundancy degree. Then, in step S25, the first calculator 53 calculates a first rank point on the basis of the second rate which is lower than the first rate. The first rank point is preferably calculated so as to be higher as the redundancy degree is higher. The first rank point may be calculated on the basis of the product of the redundancy degree and the second rate, although the present disclosure is not specifically limited thereto.

In the power supply/demand adjustment method according to the aspect disclosed herein, a high first rank point is calculated in the case where an urgency degree is calculated compared to the case where a redundancy degree is calculated as discussed above. With such a configuration, a particularly high first rank point is calculated when the urgency degree is high. Thus, the user of the electric vehicle 10 can be promoted to participate in the power supply/demand adjustment more adequately when the urgency degree is particularly high.

Steps S30 and S31 in FIG. 7 are performed in S3 in FIGS. 5 and 6. In step S30, the second communication unit 42 in FIG. 2 transmits a charge/discharge request notification on the basis of an instruction from the first calculator 53. The charge/discharge request notification to be transmitted includes at least information about the first rank point. The charge/discharge request notification is transmitted to the user terminal 15 via the second communication unit 42.

The transmitted charge/discharge request notification is preferably configured to be displayed on the screen 16 of the user terminal 15. Specifically, at least information about the first rank point may be presented to the user of the electric vehicle 10, for example. At this time, a list of the charge/discharge spots 20 that can be used, the distances from the present position of the user to the charge/discharge spots 20, etc. may be displayed. The list may have a function of rearranging the charge/discharge spots 20 in the order of the distance etc. When the user has determined the charge/discharge spot 20 at which charge or discharge is to be performed, a route to the determined charge/discharge spot 20 may be indicated. The user terminal 15 may have a function of providing guidance on the route to the charge/discharge spot 20.

In the case where the user accepts a charge/discharge request after confirming the presented charge/discharge request notification, the user transmits the vehicle information D2 on the electric vehicle 10 and the user ID of the user himself/herself from the user terminal 15 to the resource aggregator 30 by operating the input unit 17. At this time, additional information such as the charge/discharge spot 20 at which the user performs charge or discharge and the charge/discharge amount desired by the user may be transmitted in association with the vehicle information D2 etc.

In step S31, the vehicle information acquisition unit 57 receives the vehicle information D2 transmitted from the user terminal 15 via the second communication unit 42.

In a suitable aspect, in step S30, the selector 58 in FIG. 2 selects electric vehicles or users sequentially in the descending order of the rank as the transmission destination for the charge/discharge request notification, and instructs the second communication unit 42 to transmit the charge/discharge request notification to the user terminal 15 at the selected transmission destination. With such a configuration, users of electric vehicles that are expected to positively contribute to the power supply/demand adjustment can be preferentially guided to the charge/discharge spot 20. Consequently, it is possible to stabilize the power supply/demand balance more suitably.

In step S30, the selector 58 may select a transmission destination for the charge/discharge request notification with reference to the vehicle information D2 acquired by the vehicle information acquisition unit 57. For example, the electric vehicles 10 that are positioned in the vicinity of the charge/discharge spot 20 that can be used may be sequentially selected as the transmission destination. In the case where an urgency degree is calculated, the electric vehicles 10 in a high state of charge (SOC) may be preferentially selected as the transmission destination. In the case where a redundancy degree is calculated, on the other hand, the electric vehicles 10 in a low state of charge may be preferentially selected as the transmission destination.

Steps S40 and S41 in FIG. 7 are performed in S4 in FIGS. 5 and 6. In step S40, it is determined whether or not the charge/discharge management unit 52 in FIG. 2 has received a charge/discharge start signal. The user confirms the presented charge/discharge request notification, and drives the electric vehicle 10 to the charge/discharge spot 20. When the charge/discharge spot 20 is reached, the electric vehicle 10 is electrically connected to the charge/discharge device 22 to start charge or discharge. When the charge/discharge device 22 and the electric vehicle 10 are electrically connected to each other to start charge or discharge, a charge/discharge start signal is transmitted from the charge/discharge device 22 to the charge/discharge management unit 52 via the third communication unit 43. It can be determined that charge or discharge has been started when the charge/discharge management unit 52 receives the charge/discharge start signal. In the case where the resource aggregator 30 receives the charge/discharge start signal (step S40: YES), the process proceeds to step S41. In the case where the resource aggregator 30 does not receive the charge/discharge start signal even after the lapse of a predetermined time (step S40: NO), the power demand/supply process is ended. The predetermined time is not specifically limited, but may be set as appropriate to about 30 minutes to 10 hours after the charge/discharge request notification is transmitted in step S30.

Then, when charge or discharge is ended, a charge/discharge end signal is transmitted from the charge/discharge device 22 to the charge/discharge management unit 52 via the third communication unit 43. In step S41, it is determined that charge or discharge has been ended when the charge/discharge management unit 52 receives the charge/discharge end signal.

Steps S50 to S52 in FIG. 7 are performed in S5 in FIGS. 5 and 6. In step S50, the second calculator 54 in FIG. 2 acquires a charge/discharge amount measured by the charge/discharge amount measurement unit 24 of the charge/discharge device 22. The charge/discharge amount is stored in the device controller 25 of the charge/discharge device 22 in FIG. 2 in association with the ID information on the electric vehicle 10 and the user of the vehicle acquired by the ID information detector 23. Therefore, the second calculator 54 acquires a charge/discharge amount associated with ID information via the second communication unit 42.

In step S51, the second calculator 54 in FIG. 2 calculates a second rank point on the basis of the charge/discharge amount of the electric vehicle 10 electrically connected to the charge/discharge device 22. The second rank point is preferably calculated so as to be higher as the charge/discharge amount is larger. With such a configuration, a higher second rank point is calculated for a user that has substantially contributed to the power supply/demand adjustment by charging or discharging more power. Consequently, it is expected that users with large charge/discharge amounts positively participate in the power supply/demand adjustment, and the power supply/demand balance at the power transmission/distribution facility 200 can be stabilized more immediately.

In step S52, the point imparting unit 59 in FIG. 2 imparts the first rank point calculated by the first calculator 53 and the second rank point calculated by the second calculator 54 to the user. The phrase "imparting the first and second rank points to the user" indicates that the first and second rank points are registered for the user with the user ID and the first and second rank points associated with each other in the database DB1 stored in the storage 40, for example.

Step S60 in FIG. 7 is performed in S6 in FIGS. 5 and 6. In step S60, the rank setting unit 55 in FIG. 2 sets a rank on the basis of the first rank point calculated by the first calculator 53 and the second rank point calculated by the second calculator 54. By way of example, the rank setting unit 55 references the database DB1 stored in the storage 40 such as that illustrated in FIG. 4, and sets a user rank on the basis of the accumulated point of the first and second rank points registered in association with the user ID of the user of the electric vehicle 10 that has performed charge or discharge. Then, a user rank associated with the user ID in the database DB1 is preferably updated. With such a configuration, it is possible to set a user rank in consideration of each of the degree of cooperation of the user in the power supply/demand adjustment and the substantial degree of contribution. Consequently, even a user of the electric vehicle 10 that can charge or discharge a substantially small amount of power can have a motivation to participate in the power supply/demand adjustment. The resource aggregator 30 can secure more users that may participate in the power supply/demand adjustment. Therefore, the power supply/demand balance can be adjusted more suitably.

Steps S70 and S71 in FIG. 7 are performed in S7 in FIGS. 5 and 6. In step S70, the incentive management unit 56 in FIG. 2 calculates an incentive to be imparted to the user of the electric vehicle 10 on the basis of the rank set by the rank setting unit 55. The incentive management unit 56 references the database DB1 stored in the storage 40, and calculates an incentive to be imparted on the basis of the rank registered in association with the user ID of the user of the electric vehicle 10 that has performed charge or discharge. Typically, the incentive management unit 56 is configured to calculate a higher incentive as the rank is higher.

Then, in step S71, the incentive management unit 56 in FIG. 2 imparts the calculated incentive to the user. The phrase "imparting an incentive" indicates that a user ID and an incentive are associated with each other in the database DB1 stored in the storage 40 to register the incentive for the user, for example. In the case where the incentive is something that is electronically exchangeable, e.g. an electronic coupon etc., for example, the incentive may be imparted by transmitting the electronic coupon etc. to the user terminal 15.

As discussed above, each of the degree of cooperation of the user in the power supply/demand adjustment and the substantial degree of contribution can be calculated as a rank point by the first calculator 53 calculating a first rank point based on the urgency degree or the redundancy degree and the second calculator 54 calculating a second rank point based on the actual charge/discharge amount. Consequently, even a user of the electric vehicle 10 that can charge or discharge a substantially small amount of power can have a motivation to participate in the power supply/demand adjustment. There is a merit in positively participating in the power supply/demand adjustment, as the user of the electric vehicle 10 can raise his/her own rank by gaining more rank points by positively participating in the power supply/demand adjustment when the urgency degree or the redundancy degree is high. With such a configuration, meanwhile, the resource aggregator 30 can adjust the power supply/ demand balance more suitably, as an appropriate charge/discharge amount can be obtained at a necessary timing when charge or discharge of power is requested by the power transmission/distribution facility 200.

While a specific example of the present disclosure has been described in detail above, this is merely exemplary, and does not limit the scope of the claims. The technology described in the claims includes various alterations and modifications of the specific example indicated above.

What is claimed is:

1. A power system apparatus comprising:
   a power supply/demand information acquisition unit configured to acquire power supply/demand information from a power transmission/distribution facility;
   a first calculator configured to calculate an urgency degree or a redundancy degree on the basis of the power supply/demand information, and calculate a first rank point on the basis of the urgency degree or the redundancy degree;
   a communication unit configured to transmit, to a user of an electric vehicle, a charge/discharge request notification that includes at least information about the calculated first rank point;
   a charge/discharge management unit configured to manage a charge/discharge amount of the electric vehicle;
   a second calculator configured to acquire the charge/discharge amount on the basis of data ascertained by the charge/discharge management unit, and calculate a second rank point on the basis of the charge/discharge amount;
   a rank setting unit configured to set a rank based on the first rank point calculated by the first calculator and the second rank point calculated by the second calculator; and
   an incentive management unit configured to calculate an incentive to be imparted to the user of the electric vehicle on the basis of the rank set by the rank setting unit, wherein
   the power supply/demand information acquired by the power supply/demand information acquisition unit includes at least a predicted power demand amount and a predicted power supply amount;
   the first calculator is configured to calculate the urgency degree and calculate the first rank point on the basis of a first rate in the case where the predicted power demand amount is more than the predicted power supply amount; and
   the first calculator is configured to calculate the redundancy degree and calculate the first rank point on the basis of a second rate, which is lower than the first rate, in the case where the predicted power supply amount is more than the predicted power demand amount.

2. The power system apparatus according to claim 1, wherein
   the first calculator is configured to calculate a higher first rank point as the urgency degree or the redundancy degree is higher.

3. The power system apparatus according to claim 1, further comprising
   a selector configured to select a transmission destination for the charge/discharge request notification, wherein the selector is configured to select users of electric vehicles for transmission destination for the charge/discharge request notification sequentially in a descending order of the rank set by the rank setting unit.

4. A power supply/demand adjustment method of adjusting a power supply/demand balance at a power transmission/distribution facility using an electric vehicle, the method comprising:
   acquiring power supply/demand information from the power transmission/distribution facility;
   calculating an urgency degree or a redundancy degree on the basis of the power supply/demand information;
   calculating a first rank point on the basis of the calculated urgency degree or redundancy degree;
   transmitting, to a user of the electric vehicle, a charge/discharge request notification that includes at least the first rank point;
   managing a charge/discharge state of the electric vehicle using a charge/discharge management unit;
   acquiring a charge/discharge amount of the electric vehicle on the basis of the managed charge/discharge state;
   calculating a second rank point on the basis of the charge/discharge amount;
   setting a rank on the basis of the calculated first rank point and second rank point; and
   calculating an incentive to be imparted to the user of the electric vehicle on the basis of the rank, wherein
   the power supply/demand information acquired in the acquiring the power supply/demand information includes at least a predicted power demand amount and a predicted power supply amount;
   in the step of calculating the urgency degree or the redundancy degree, in the case where the predicted power demand amount is more than the predicted power supply amount, the urgency degree is calculated;
   in the step of calculating the urgency degree or the redundancy degree, in the case where the predicted power supply amount is more than the predicted power demand amount, the redundancy degree is calculated;
   in the case where the urgency degree is calculated, the first rank point on the basis of a first rate is calculated in the step of calculating the first rank point; and
   in the case where the redundancy degree is calculated, the first rank point on the basis of a second rate, which is lower than the first rate, is calculated in the step of calculating the first rank point.

5. The power supply/demand adjustment method according to claim 4, wherein
   in the step of calculating the first rank point, the first rank point is calculated so as to be higher as the urgency degree or the redundancy degree calculated on the basis of the power supply/demand information is higher.

6. The power supply/demand adjustment method according to claim 4, further comprising
   selecting a transmission destination for the charge/discharge request notification, wherein
   users of electric vehicles are selected for transmission destination for the charge/discharge request notification sequentially in a descending order of the rank.

* * * * *